(12) United States Patent
Tsukano

(10) Patent No.: US 8,304,918 B2
(45) Date of Patent: Nov. 6, 2012

(54) METHOD FOR MANUFACTURING ELECTRONIC DEVICE AND ELECTRONIC DEVICE

(75) Inventor: Jun Tsukano, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/929,164

(22) Filed: Jan. 5, 2011

(65) Prior Publication Data

US 2011/0163458 A1 Jul. 7, 2011

(30) Foreign Application Priority Data

Jan. 6, 2010 (JP) .................................. 2010-001502

(51) Int. Cl.
*H01L 23/48* (2006.01)

(52) U.S. Cl. ................ 257/777; 257/686; 257/E25.006; 257/E25.01; 257/E25.013; 257/E25.021; 257/E25.027; 257/E23.085; 438/109

(58) Field of Classification Search .................. 257/777, 257/678–733, E25.006, E25.01, E25.013, 257/E25.021, E25.027, E23.085, 783, 787, 257/795; 438/109

See application file for complete search history.

(56) References Cited

U.S. PATENT DOCUMENTS

2004/0222509 A1* 11/2004 Ogata ........................... 257/686

FOREIGN PATENT DOCUMENTS

JP 2005-340415 A 12/2005

* cited by examiner

*Primary Examiner* — Jasmine Clark

(74) *Attorney, Agent, or Firm* — McGinn IP Law Group, PLLC

(57) ABSTRACT

An electronic device is disclosed which can suppress the formation of voids in a region below an overhanging portion of a first semiconductor device overhanging a support member. The support member is disposed over a package substrate. The first semiconductor device is disposed over the support member and, when seen in plan, at least a part of the first semiconductor device overhangs the support member. A first resin layer fills up a space below the first semiconductor device in at least a part of the overhanging portion of the first semiconductor device around the support member. The first resin layer is in contact with the support member. A second resin layer seals the first semiconductor device and the support member.

16 Claims, 12 Drawing Sheets

METHOD FOR MANUFACTURING ELECTRONIC DEVICE AND ELECTRONIC DEVICE

CROSS-REFERENCE TO RELATED APPLICATIONS

The disclosure of Japanese Patent Application No. 2010-1502 filed on Jan. 6, 2010 including the specification, drawings and abstract is incorporated herein by reference in its entirety.

BACKGROUND

1. Field of the Invention

The present invention relates to a method for manufacturing an electronic device having a semiconductor device mounted on a package substrate through a support member, as well as the electronic device.

2. Description of Related Art

An electronic device having a semiconductor device is always required to be reduced in size and have multiple functions. As structures meeting this requirement there have been developed a CoC (Chip on Chip) structure having plural semiconductor chips stacked on one and same package substrate and a PinP (Package in Package) structure having a semiconductor package put into another semiconductor package. In these structures, a semiconductor device such as a semiconductor chip or a semiconductor package is mounted onto a package substrate through a support member such as a spacer or a lower-side semiconductor device. There sometimes is a case where a semiconductor device overhangs a support member to form an overhanging portion.

In Patent Document 1 it is described that when mounting on a semiconductor chip or a spacer a larger semiconductor chip, a support member is disposed under a peripheral portion of the upper semiconductor chip. The technique described in Patent Document 1 is for solving the problem that when bonding the upper semiconductor chip, a partial load is imposed on the upper semiconductor chip, with consequent occurrence of damage or breaking of wire.

PRIOR ART DOCUMENT

Patent Document 1: Japanese Unexamined Patent Publication No. 2005-340415

SUMMARY

As a result of studies made by the present inventors it turned out that in case of sealing an electronic device with a semiconductor device protruding from a support member, namely, overhanging the support member, voids were formed below the overhanging portion. Once such voids are formed, the durability of the semiconductor device is deteriorated.

For suppressing the formation of voids below the overhanging portion, the present inventors have made a study about introducing a first resin below the overhanging portion before sealing the electronic device with resin. In this connection, the present inventors have considered that if the first resin introducing region is made too large, the interface between the first resin and the sealing resin will become large, with the result that peeling becomes more likely to occur at the said interface and the durability of the semiconductor device is deteriorated.

According to one aspect of the present invention, a method for manufacturing an electronic device includes:

disposing a support member over a package substrate;
forming a first resin layer in part of the environs of the support member so as to contact the support member; and
mounting a first semiconductor device over the support member in a state,
in which, the first semiconductor device overhangs the support member at least in the direction where the first resin layer is formed, and
sealing the support member and the first semiconductor device with a second resin supplying from a side opposite to the first resin layer though the support member.

Studies made by the present inventors have revealed that voids are formed in a region located on the side opposite to a sealing resin injection port through the support member below the overhanging portion. This is presumed to because the sealing resin is difficult to flow into the said region. In the present invention, before sealing the semiconductor device disposed over the package substrate, a first resin is formed in part of the environs of the support member and a second resin as sealing resin is supplied from the side opposite to the first resin layer through the support member when seen in plan. Thus, in the present invention, in a resin sealing state, the first resin is formed beforehand in a region where voids are apt to occur, namely, a portion where the second resin is difficult to enter, below the overhanging portion of the first semiconductor device. Accordingly, it is possible of suppress the formation of voids in the region below the overhanging portion of the first semiconductor device.

Moreover, since the first resin layer is formed in only a part of the environs of the support member, the interface between the first resin layer and the second resin layer can be prevented from becoming larger than necessary and hence it is possible to suppress the occurrence of peeling between the first and second resin layers.

According to another aspect of the present invention, an electronic device includes:

a package substrate;
a support member disposed over the package substrate;
a first semiconductor device disposed over the support member and overhanging the support member at least partially in plan view;
a first resin layer filling up a space below the first semiconductor device in part of the overhanging portion of the semiconductor device around the support member, the first resin layer being in contact with the support member; and
a second resin layer sealing both the semiconductor device and the support member.

According to the present invention it is possible to suppress the formation of voids in the region below the portion where the first semiconductor device overhangs the support member.

DETAILED DESCRIPTION OF THE PREFERRED EMBODIMENTS

Figure 1:
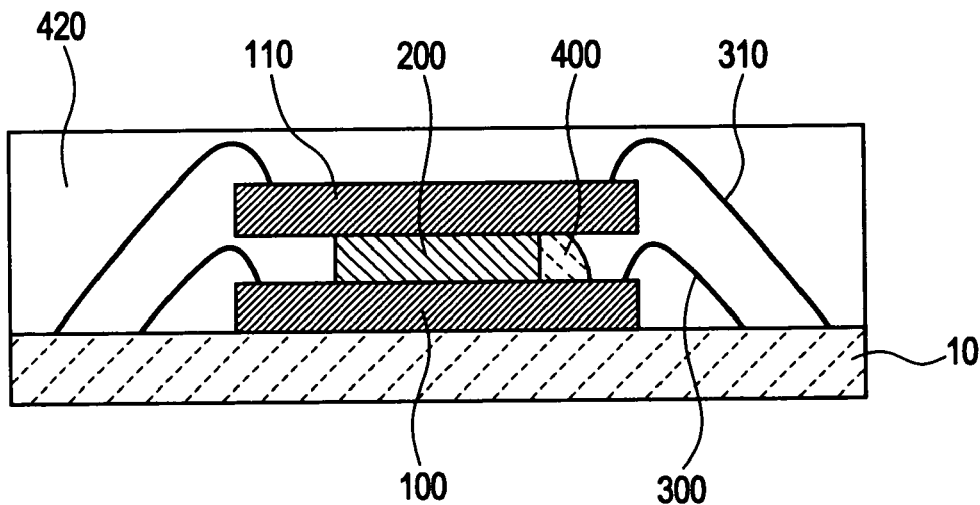
FIG. 1 is a sectional view showing the configuration of an electronic device according to a first embodiment of the present invention.

Embodiments of the present invention will be described below with reference to the accompanying drawings. In all of the drawings, the same components are identified by the same reference numerals, and explanations thereof will be omitted accordingly.

First Embodiment

FIG. 1 is a sectional view showing the configuration of an electronic device according to a first embodiment of the present invention. This electronic device includes a package substrate 10, a support member 200, a first semiconductor device 110, a first resin layer 400 and a second resin layer 420. The support member 200 is disposed over the package substrate 10. The first semiconductor device 110 is disposed on the support member 200. At least a part of the first semiconductor device 110 overhangs the support member 200 when seen in plan. The first resin layer 400 fills up a space around the support member 200 and below the first semiconductor device 110 in part of the overhanging portion of the first semiconductor device 110 and it is in contact with the support member 200. The second resin layer 420 seals the first semiconductor device 110 and the support member 200.

In this embodiment, a second semiconductor device 100 is disposed on the package substrate 10. The support member 200 is a spacer and is disposed on the second semiconductor device 100. The first semiconductor device 110 and the second semiconductor device 100 are semiconductor chips and the electronic device shown in FIG. 1 has a Chip on Chip structure comprising the second semiconductor device 100, the support member 200 as a spacer and the first semiconductor device 110, which are stacked in this order onto the package substrate 10. The first semiconductor device 110 has an active surface facing up and is coupled to the package substrate 10 through bonding wires 310. The second semiconductor device 100 also has an active surface facing up and is coupled to the package substrate 10 through bonding wires 300. The second resin layer 420 also seals the first semiconductor device 110 and the bonding wires 300, 310 in addition to the second semiconductor device 100, the support member 200 and the first resin layer 400.

Figure 2:
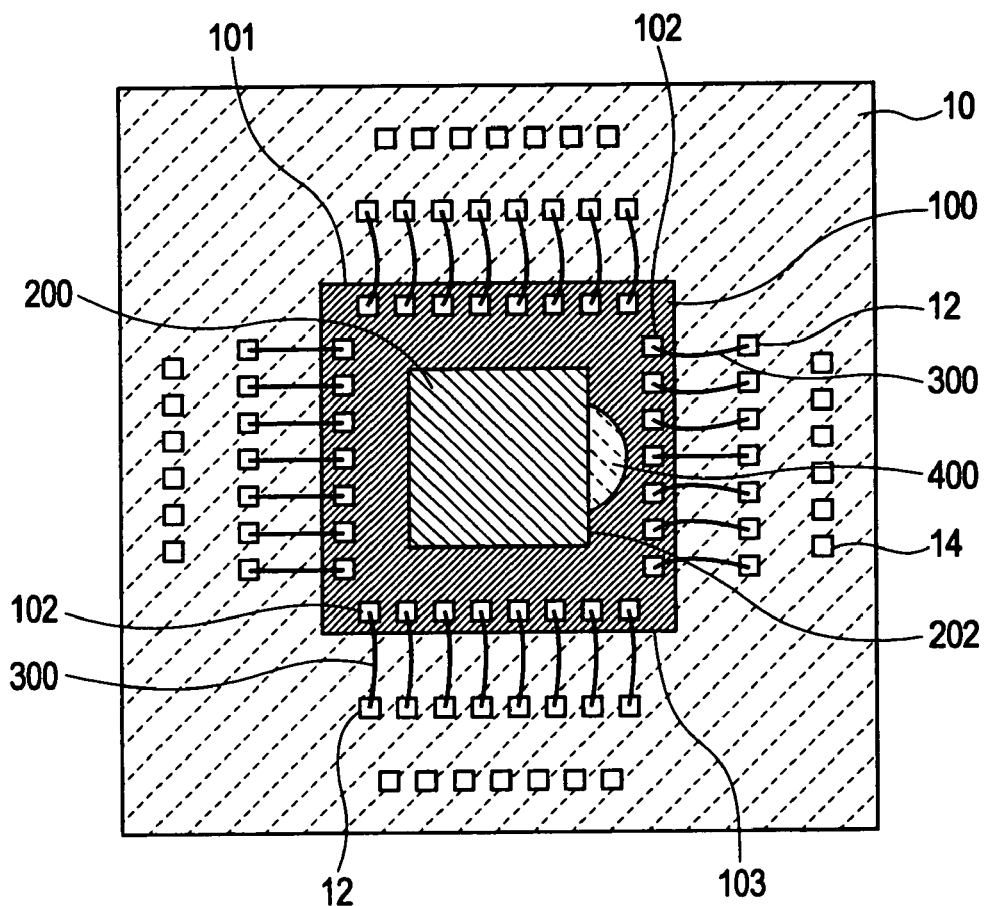
FIG. 2 is a plan view showing a layout of a package substrate, a second semiconductor device, a support member and a first resin layer in the electronic device shown in FIG. 1.

FIG. 2 is a plan view showing a layout of the package substrate 10, the second semiconductor device 100, the support member 200 and the first resin layer 400. The package substrate 10, the second semiconductor device 100 and the support member 200 are each square or rectangular and are disposed so that the respective four sides are parallel to one another and so that they are aligned with one another. The first resin layer 400 is formed on one side 202, exclusive of both ends thereof, of the support member 200. For example, the first resin layer 400 is formed in a region of not less than 20% and not more than 100%, preferably not less than 50% and not more than 100%, of one side 202. In the illustrated example the first resin layer 400 is formed in a region of not less than 50% of one side 202.

Plural electrode pads 102 as external coupling terminals are formed on the second semiconductor device 100. The electrode pads 102 are formed along each of the four sides of the second semiconductor device 100 and are coupled respectively to plural electrodes 12 on the package substrate 10 through the bonding wires 300 which are different from one another. The first resin layer 400 coves none of the electrode pads 102 and the bonding wires 300.

Part of the electrode pads 102 are formed along two sides 101 and 103 extending perpendicularly to one side 202 of the support member 200 in the second semiconductor device 100. In at least one of the bonding wires 300 coupled to the electrode pads 102 formed along the two sides 101 and 13, a vertex thereof is positioned near the first resin layer 400 with respect to a straight line joining both ends of the bonding wire 300 concerned when seen in plan. This is because the vertex of the bonding wire 300 is deflected by the flow of resin in a process of forming the second resin layer 420 which will be described later.

Electrodes 14 are formed on the package substrate 10 at positions closer to edges with respect to the electrodes 12. The electrodes 14 are coupled to electrode pads on the first semiconductor device 110 through the bonding wires 310 shown in FIG. 1.

Figure 3:
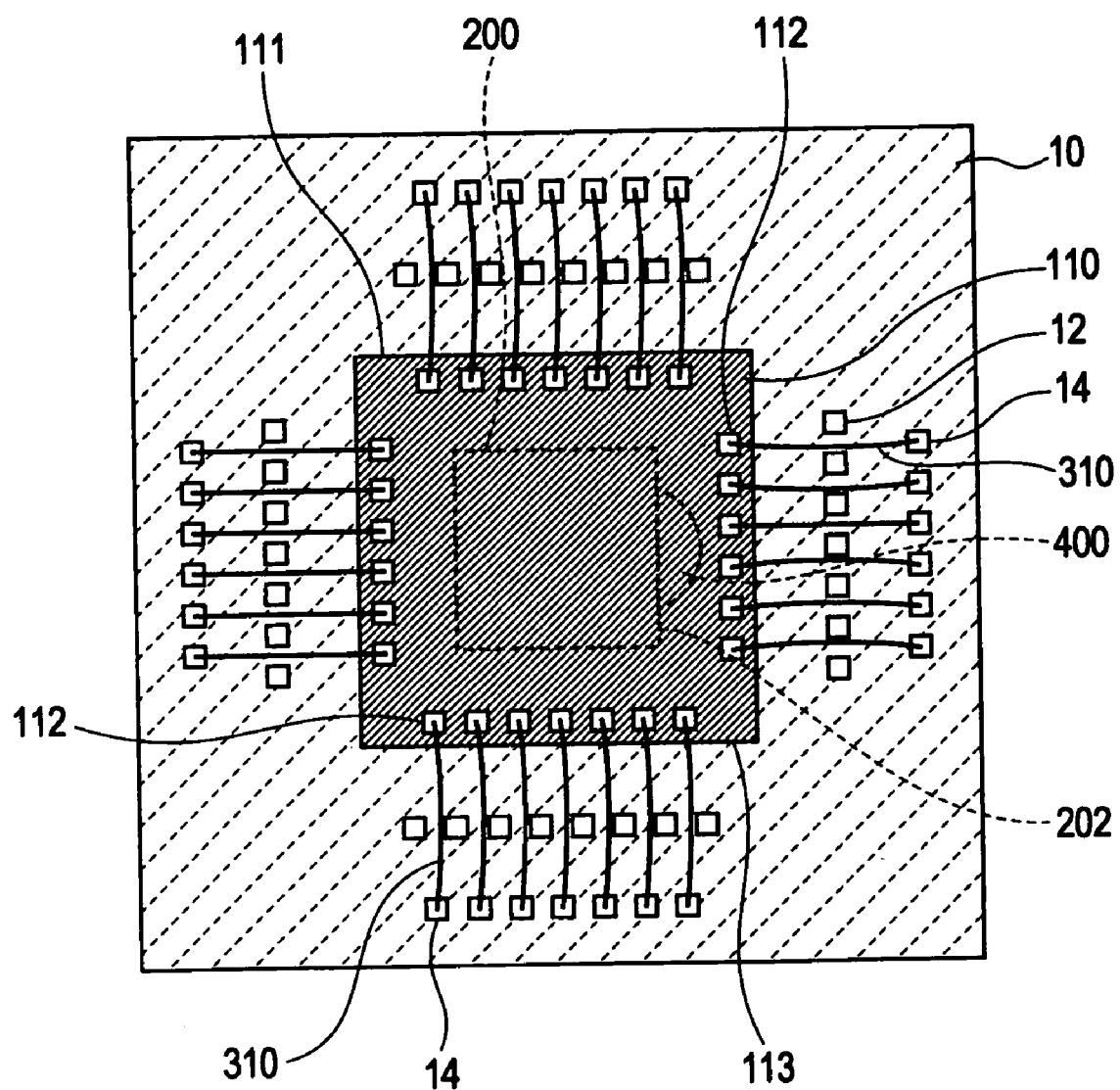
FIG. 3 is a plan view showing a layout of the package substrate, the support member and a first semiconductor device in the electronic device shown in FIG. 1.

FIG. 3 is a plan view showing a layout of the package substrate 10, the support member 200 and the first semiconductor device 110 in the electronic device shown in FIG. 1. For explanation, the support member 200 and the first resin layer 400 are indicated with dotted lines, and the illustration of the bonding wires 300 is omitted.

The first semiconductor device 110 is square or rectangular and is disposed so that its four sides are parallel to the four sides respectively of the support member 200 and so as to be aligned with the support member 200. On the four sides of the first semiconductor device 110 are formed plural electrode pads 112 along edges. At least a part of the electrode pads 112, for example electrode pads 112 formed along two sides 111 and 113 extending perpendicularly to one side 202 of the support member in the first semiconductor device 110, do not overlap the first resin layer 400 when seen in plan. In the illustrated example, none of the electrode pads 112 overlap the first resin layer 400. The electrode pads 112 are coupled through the bonding wires 310 to the electrodes 14 formed on the package substrate 10.

Part of the electrode pads 112 are disposed along the two sides 111 and 113. In at least one of the bonding wires 310 coupled to the electrode pads 112 disposed along the two sides 111 and 113, a vertex thereof is positioned near the first resin layer 400 with respect to a straight line joining both ends of the bonding wire 310 concerned when seen in plan. This is because the vertex of the bonding wire 310 is deflected by the flow of resin in a process of forming the second resin layer 420 which will be described later.

Figure 4A:
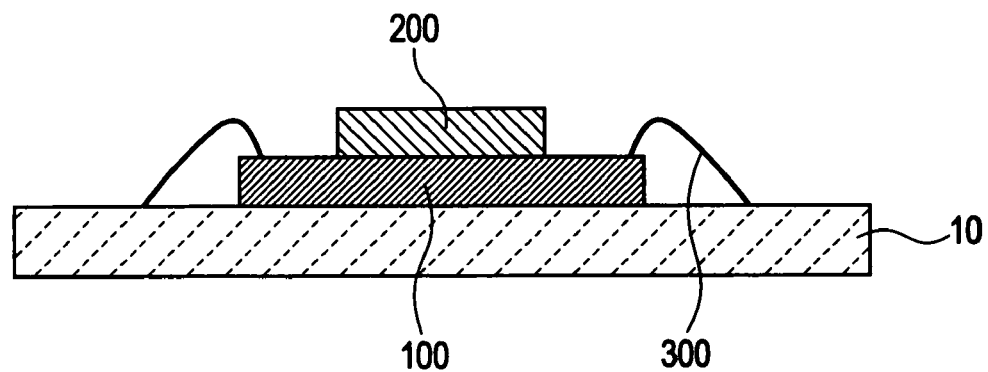
FIGS. 4A and 4A are sectional views showing a method for manufacturing the semiconductor device shown in FIGS. 1 to 3.
Figure 4B:
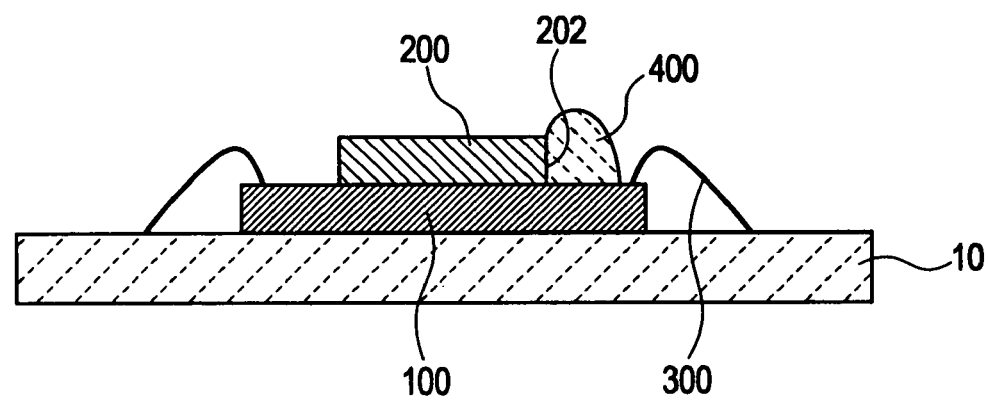
Figure 5:
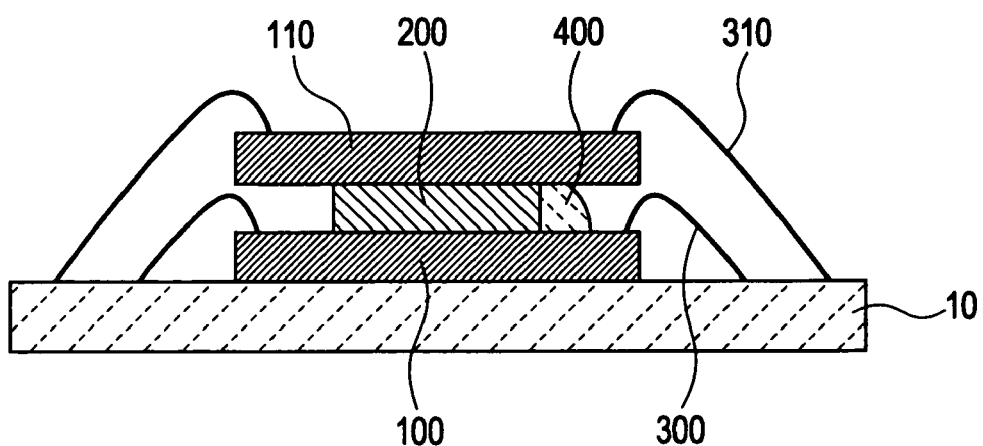
FIG. 5 is a sectional view showing a method for manufacturing the semiconductor device shown in FIGS. 1 to 3.

FIGS. 4A, 4B and FIG. 5 are sectional views showing a method for manufacturing the electronic device shown in FIGS. 1 to 3. This electronic device manufacturing method roughly comprises the following steps. First, the support member 200 is disposed over the package substrate 10. Then, the first resin layer 400 is formed in part of the environs of the support member 200 so as to contact the support member 200. Next, the first semiconductor device 110 is disposed on the support member 200 in a state in which, when seen in plan, the semiconductor device 110 overhangs the support member at least in the direction where the first resin layer 400 is provided. Thereafter, the support member 200 and the first semiconductor device 110 are sealed with the second resin layer 420. At this time, the resin which forms the second resin layer 420 is supplied from the side opposite to the first resin layer 400 through the support member 200 when seen in plan. A detailed description will be given below.

First, as shown in FIG. 4A, the second semiconductor device 100 is mounted on the package substrate 10 in a state in which its active surface faces up. At this time, a mount material (not shown) is disposed between the package substrate 10 and the second semiconductor device 100. Then, the second semiconductor device 100 and the package substrate 10 are coupled together through the bonding wires 300. Further, the support member 200 serving as a spacer is disposed on the second semiconductor device 100. At this time, a mount material (not shown) is disposed between the second semiconductor device 100 and the support member 200.

The bonding wires 300 may be provided after disposing the support member 200 on the second semiconductor device 100.

Then, as shown in FIG. 4B, the first resin layer 400 is formed on one side 202 of the support member 200. In this case, it is optional whether the first resin layer 400 is to be formed on the whole of one side 202 or on part of one side 202 exclusive of both ends so as to contact the said part. The first resin layer 400 is formed by for example a droplet method. The first resin layer 400 is formed so that an upper end thereof is positioned higher than an upper surface of the support member 200 in this state. Further, the first resin layer 400 is formed so as not to cover the electrode pads 102 (shown in FIG. 2) of the second semiconductor device 100 and the bonding wires 300.

Next, as shown in FIG. 5, the first semiconductor device 110 is mounted on the support member 200 in a state in which its active surface faces up. At this time, a mount material (not shown) is disposed between the support member 200 and the first semiconductor device 110. When mounting the first semiconductor device 110 onto the support member 200, the upper end of the first resin layer 400 is crushed by a lower surface of the first semiconductor device 110. Consequently, voids are prevented from remaining among a lower surface of the first semiconductor device 110, the associated side face of the support member 200 and the first resin layer 400.

Then, the first semiconductor device 110 and the package substrate 10 are coupled together through the bonding wires 310.

Thereafter, using a sealing device, the second semiconductor device 100, the support member 200, the first resin layer 400, the first semiconductor device 110 and the bonding wires 300, 310 are sealed with the second resin layer 420.

Figure 6:
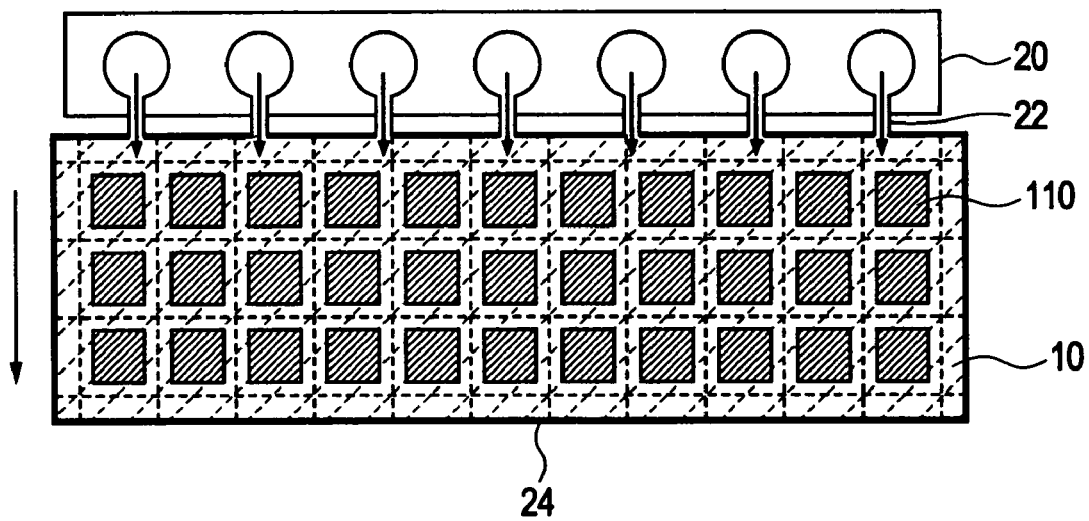
FIG. 6 is a schematic plan view showing a method for forming a second resin layer.

FIG. 6 is a schematic plan view showing a method for forming the second resin layer 420. The package substrate 10 is in a state before divided into plural electronic devices. The second semiconductor device 100, the support member 200, the first resin layer 400, the first semiconductor device 110 and the bonding wires 300, 310 are provided in each electronic device area. In FIG. 6, only the first semiconductor device 110 is shown for explanation.

The package substrate 10 is disposed within a mold 24. Plural gates 22 as resin injection ports are coupled to the mold 24. Resin is injected into the mold 24 from a resin injection device 20 through the gates 22. In this case, the gates 22 are positioned on the side opposite to the first resin layer 400 (not shown) through the support member 200 (not shown) when seen in plan. Therefore, the resin for forming the second resin layer 420 is supplied from the side opposite to the first resin layer 400 (not shown) through the support member 200 (not shown) when seen in plan. In the environs of the support member 200, the first resin layer 400 is formed in the portion where voids are apt to occur. Consequently, at the time of sealing with the second resin layer 420, it is possible to suppress the formation of voids in the second resin layer 420.

The first resin layer 400 is formed so as not to cover the electrode pads 102 of the second semiconductor device 100 and the bonding wires 300. Thus, end portions of the bonding wires 300 are not fixed by the first resin layer 400, so that it is possible to prevent breaking of the bonding wires 300 which is caused by the flow of resin at the time of forming the second resin layer 420.

Thereafter, division is made into individual electronic devices by cutting the package substrate 10 and the second resin layer 420 along the dotted lines in FIG. 6.

Next, the following description is provided about the function and effect of this embodiment. In this embodiment a planar shape of the first semiconductor device 110 is larger than that of the support member 200. Therefore, the first semiconductor device 110 overhangs the support member 200. In such a shape, the resin for forming the second resin layer 420 is difficult to flow into the region positioned on the side opposite to the gates 22 in the environs of the support member 200, so that voids are apt to occur in the said region. In this embodiment, in view of this point, the first resin layer 400 is formed in the portion opposite to the gates 22 in the environs of the support member 200, prior to forming the second resin layer 420. Accordingly, it is possible to suppress the formation of voids in the region below the overhanging portion of the first semiconductor device 110.

Besides, since the first resin layer 400 is formed in only part of the environs of the support member 200, the interface between the first resin layer 400 and the second resin layer 420 can be prevented from becoming larger than necessary. Consequently, it is possible to suppress the occurrence of peeling between the first resin layer 400 and the second resin layer 420.

Figure 7:
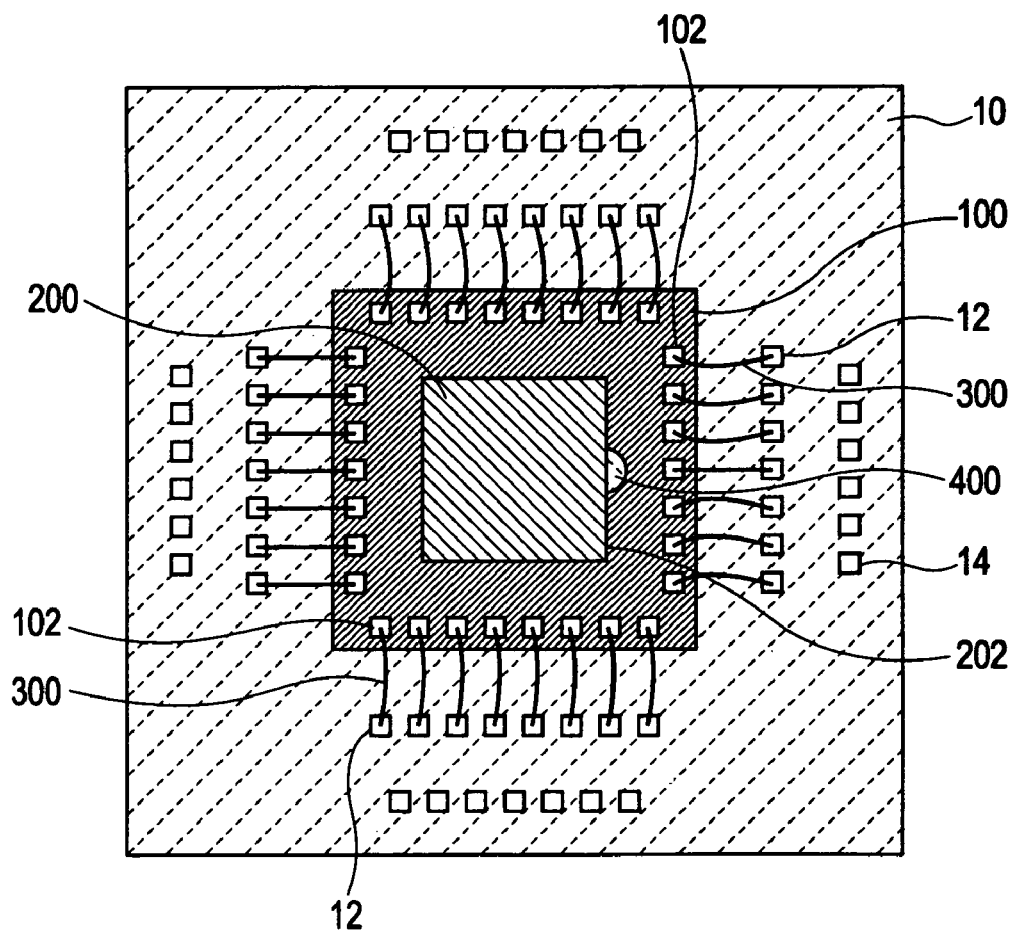
FIG. 7 is a plan view showing a modification of the electronic device.

Although in this embodiment, as shown in FIG. 2, the first resin layer 400 is formed in a region of not less than 50% of one side 202 of the support member 200, it may be formed in a region of less than 50% of one side 202 of the support member 200, as shown in FIG. 7.

Second Embodiment

Figure 8:
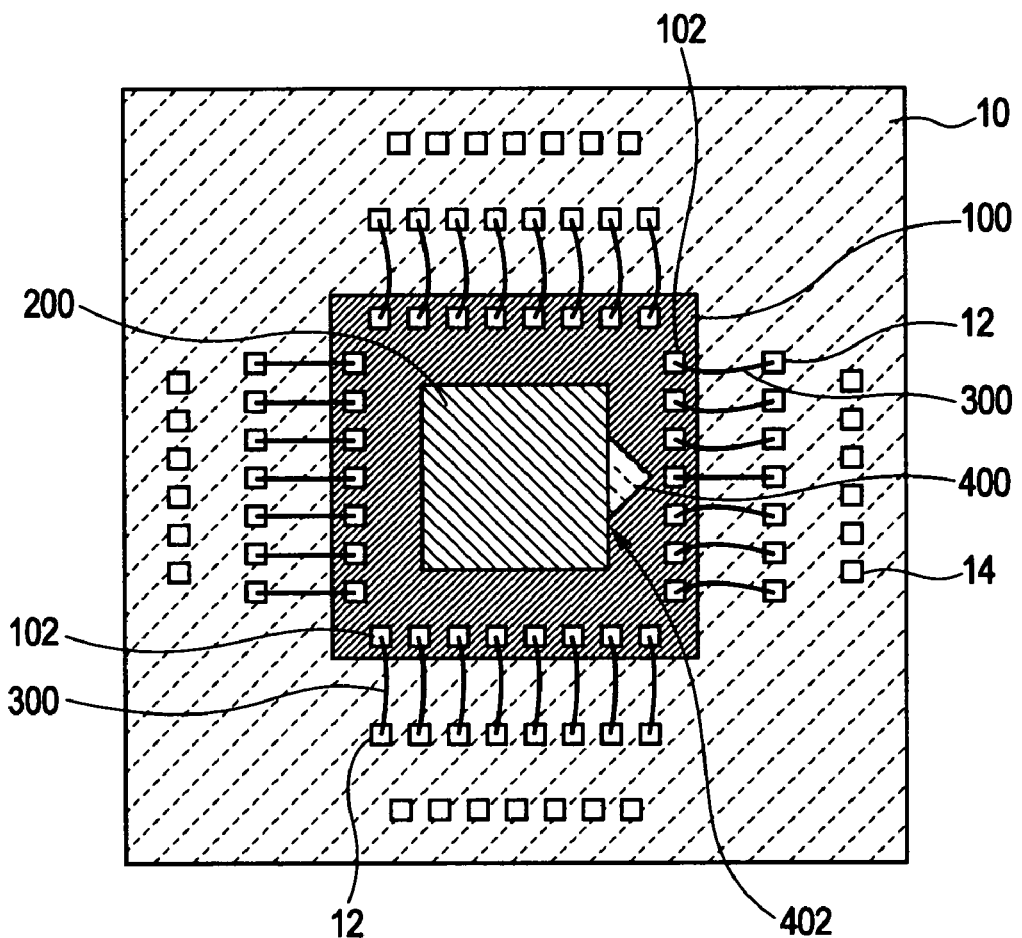
FIG. 8 is a plan view showing the configuration of an electronic device according to a second embodiment of the present invention.

FIG. 8 is a plan view showing the configuration of an electronic device according to a second embodiment of the present invention. FIG. 8 corresponds to FIG. 2 referred to in the first embodiment. The electronic device of this second embodiment is of the same configuration as the electronic device of the first embodiment except a planar shape of a first resin layer 400.

The first resin layer 400 used in this second embodiment has a triangular shape, e.g., isosceles triangle, when seen in plan. One side, for example a base of an isosceles triangle, is in contact with the support member 200. For example, such a shape of the first resin layer 400 can be obtained by sticking a sheet-like resin layer.

According to this second embodiment it is possible to obtain the same effects as in the first embodiment. Besides, a corner 402 which defines a boundary between a side face of the support member 200 and the first resin layer 400 can be formed at an obtuse angle. Consequently, it is possible to suppress the formation of voids at the corner 402.

Third Embodiment

Figure 9:
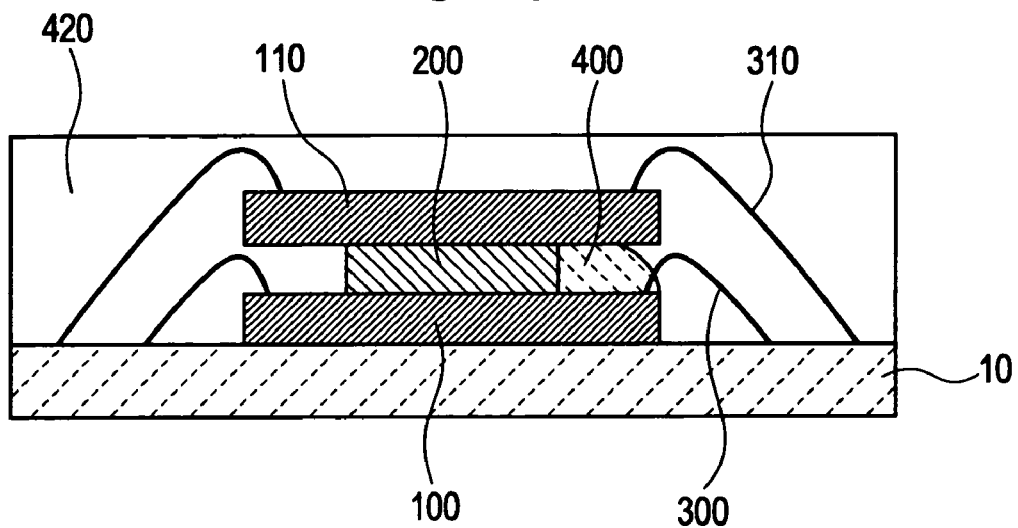
FIG. 9 is a sectional view showing the configuration of an electronic device according to a third embodiment of the present invention.

FIG. 9 is a sectional view showing the configuration of an electronic device according to a third embodiment of the present invention. FIG. 9 corresponds to FIG. 1 referred to in the first embodiment. The electronic device of this third embodiment is of the same configuration as the electronic device of the first embodiment except that a first resin layer 400 covers end portions of bonding wires 300 and electrode pads 102 shown in FIG. 2.

Also according to this embodiment, like the first embodiment, it is possible to suppress the formation of voids in the region below the overhanging portion of the first semiconductor device 110 and possible to suppress the occurrence of peeling between the first resin layer 400 and the second resin layer 420.

Fourth Embodiment

Figure 10:
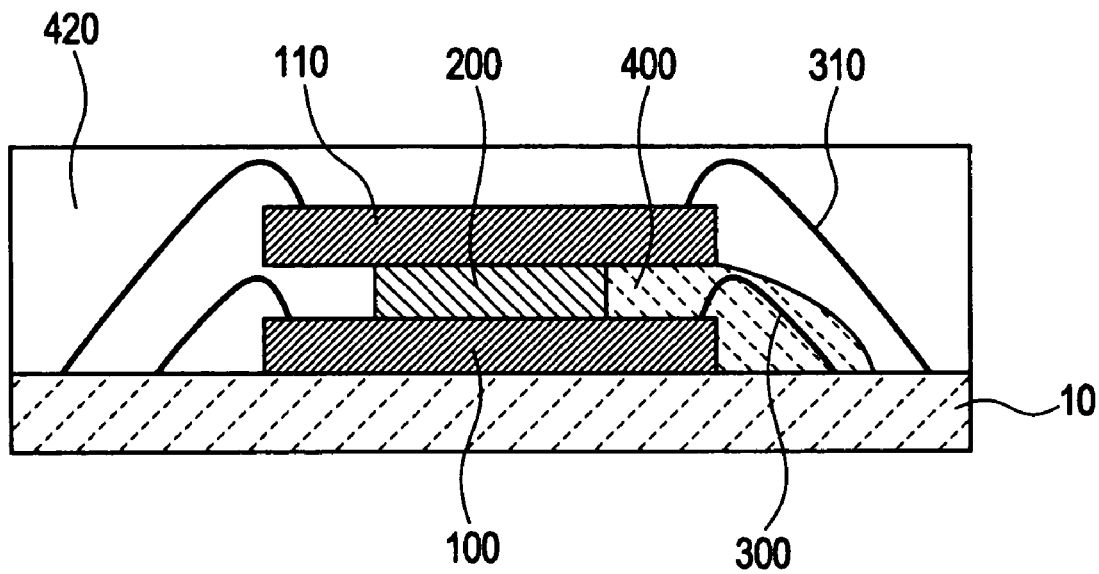
FIG. 10 is a sectional view showing the configuration of an electronic device according to a fourth embodiment of the present invention.

FIG. 10 is a sectional view showing the configuration of an electronic device according to a fourth embodiment of the present invention. FIG. 10 corresponds to FIG. 1 referred to in the first embodiment. The electronic device of this fourth embodiment is of the same configuration as the electronic device of the first embodiment except that a first resin layer 400 covers the whole of bonding wires 300 and that a part of a lower surface of the first resin layer 400 is in contact with an upper surface of the package substrate 10.

Also according to this fourth embodiment, like the first embodiment, it is possible to suppress the formation of voids in the region below the overhanging portion of the first semiconductor device 110 and possible to suppress the occurrence of peeling between the first resin layer 400 and the second resin layer 420.

Fifth Embodiment

Figure 11:
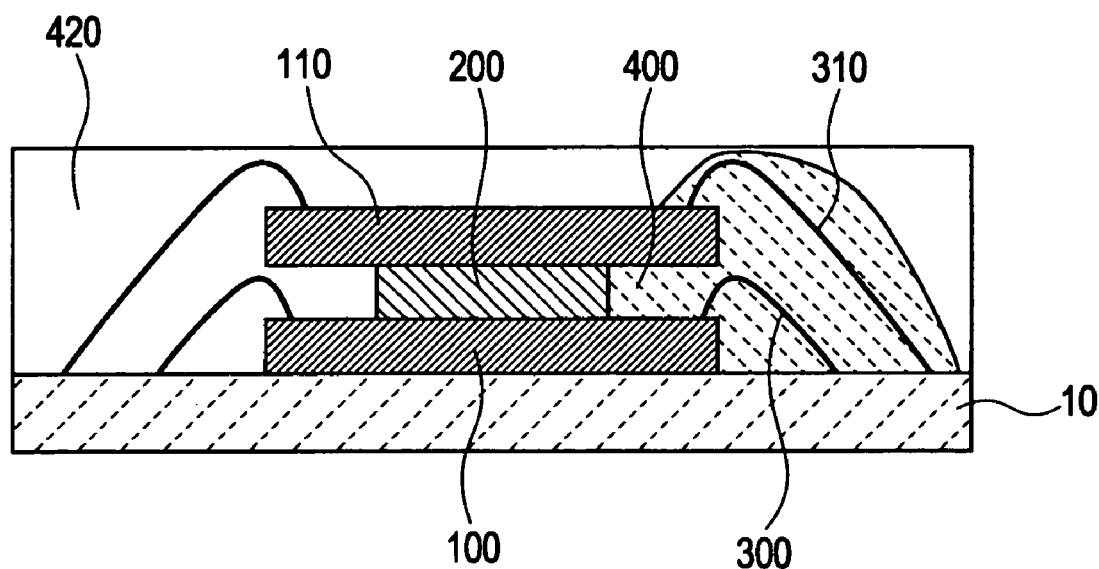
FIG. 11 is a sectional view showing the configuration of an electronic device according to a fifth embodiment of the present invention.

FIG. 11 is a sectional view showing the configuration of an electronic device according to a fifth embodiment of the present invention. FIG. 11 corresponds to FIG. 1 referred to in the first embodiment. The electronic device of this fifth embodiment is of the same configuration as the electronic device of the first embodiment except that a first resin layer 400 covers the whole of bonding wires 300, 310 and electrode pads 112 (shown in FIG. 3) of the semiconductor device 110 and that a part of a lower surface of the first resin layer 400 is in contact with an upper surface of the package substrate 10.

Figure 12A:
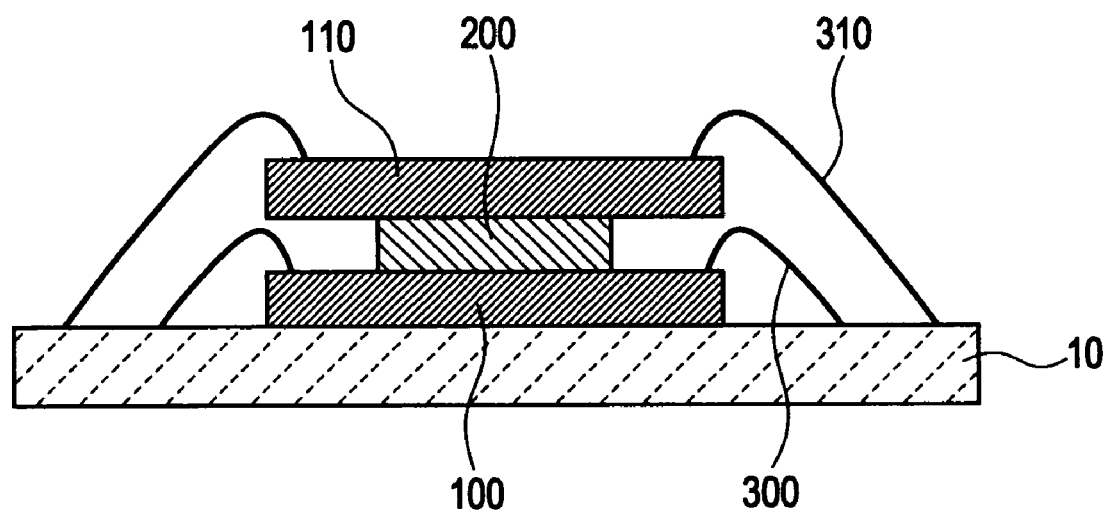
FIGS. 12A and 12B are sectional views showing a method for manufacturing the electronic device shown in FIG. 11.
Figure 12B:
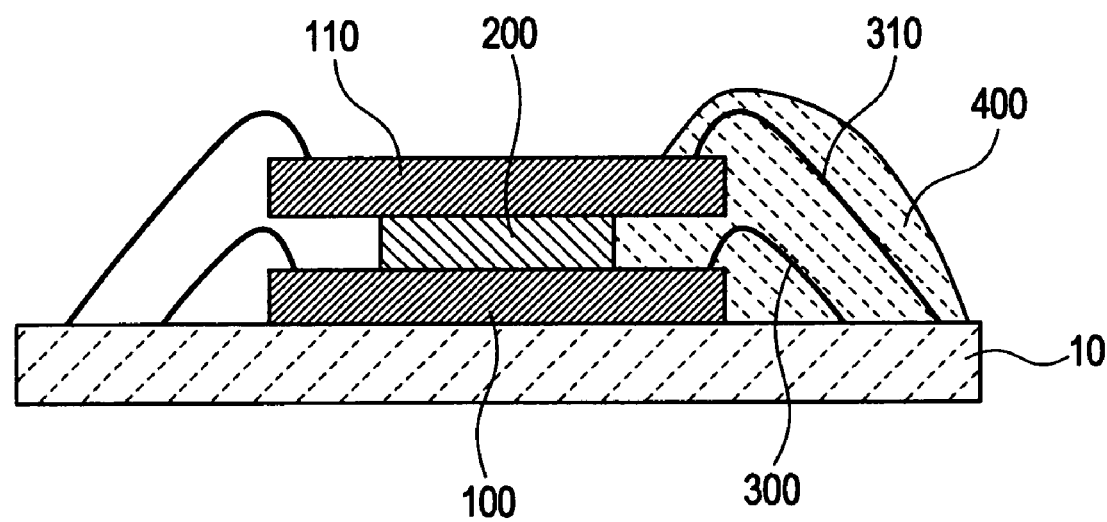

FIGS. 12A and 12B are sectional views showing a method for manufacturing the semiconductor device shown in FIG. 11. First, as shown in FIG. 12A, the second semiconductor device 100 and the support member 200 serving as a spacer are disposed on the package substrate 10 and bonding wires 300 are provided. The process of providing these components is the same as in the first embodiment. Next, prior to forming the first resin layer 400, the first semiconductor device 110 is disposed on the support member 200 and bonding wires 310 are provided.

Then, as shown in FIG. 12B, the first resin layer 400 is formed using a droplet method. At this time, the first resin layer 400 also gets into the space between the first semiconductor device 110 and the second semiconductor device 100 and contacts only a part of a side face of the support member 200.

Thereafter, the second resin layer 420 is provided. How to form the second resin layer 420 is the same as in the first embodiment.

Also according to this fifth embodiment, like the first embodiment, it is possible to suppress the formation of voids in the region below the overhanging portion of the first semiconductor device 110 and possible to suppress the occurrence of peeling between the first resin layer 400 and the second resin layer 420.

Sixth Embodiment

Figure 13:
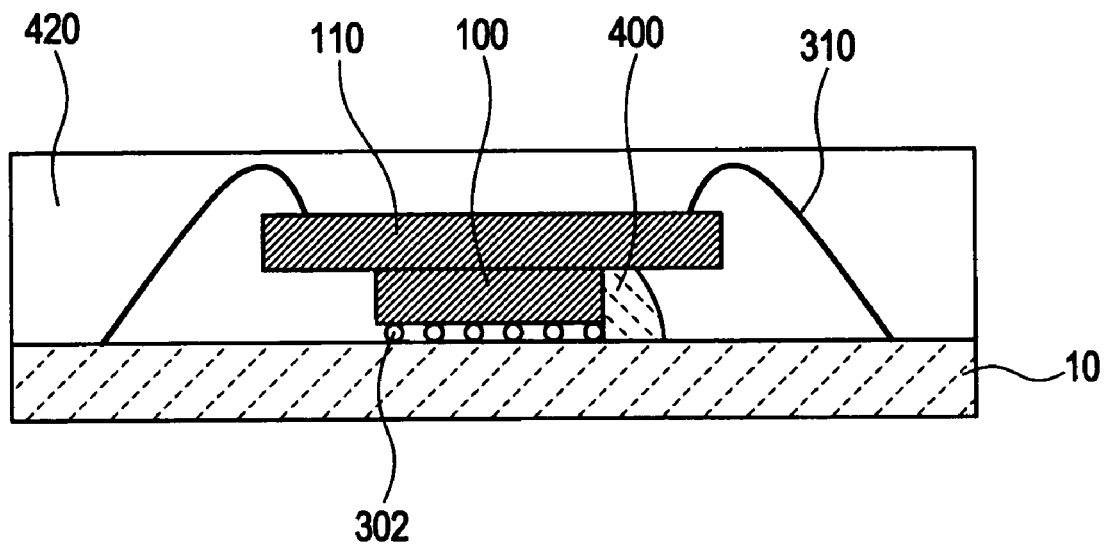
FIG. 13 is a sectional view showing the configuration of an electronic device according to a sixth embodiment of the present invention.

FIG. 13 is a sectional view showing the configuration of an electronic device according to a sixth embodiment of the present invention. FIG. 13 corresponds to FIG. 1 referred to in the first embodiment. The electronic device of this sixth embodiment is of the same configuration as the first embodiment except the following points.

First, when seen in plan, a second semiconductor device 100 is smaller than the first semiconductor device 110 and is flip-chip-mounted onto the package substrate 10 with use of bumps 302. The first semiconductor device 110 is mounted on the second semiconductor device 100. That is, in this sixth embodiment, a support member serving as a spacer is not used, but the second semiconductor device 100 is used as a support member for supporting the first semiconductor device 110. A first resin layer 400 is formed in part of an overhanging portion of the first semiconductor device 110 which overhangs the second semiconductor device 100 so as to contact a side face of the second semiconductor device 100. A mount material (not shown) is provided between the first semiconductor device 110 and the second semiconductor device 100. The space between the second semiconductor device 100 and the package substrate 10 is sealed with underfill resin (not shown).

A method for manufacturing this electronic device is as follows. First, the second semiconductor device 100 is flip-chip-mounted onto the package substrate 10. Then, the space between the second semiconductor device 100 and the package substrate 10 is sealed with underfill resin. Subsequently, the first resin layer 400 is formed by a droplet method. At this time, an upper end of the first resin layer 400 is made higher than an upper surface of the second semiconductor device 100. Thereafter, the first semiconductor device 110 is mounted on the second semiconductor device 100 and bonding wires 310 are provided. Next, the second resin layer 420 is formed.

Also according to this sixth embodiment, like the first embodiment, it is possible to suppress the formation of voids in the region below the overhanging portion of the first semiconductor device 110 and possible to suppress the occurrence of peeling between the first resin layer 400 and the second resin layer 420.

Seventh Embodiment

Figure 14:
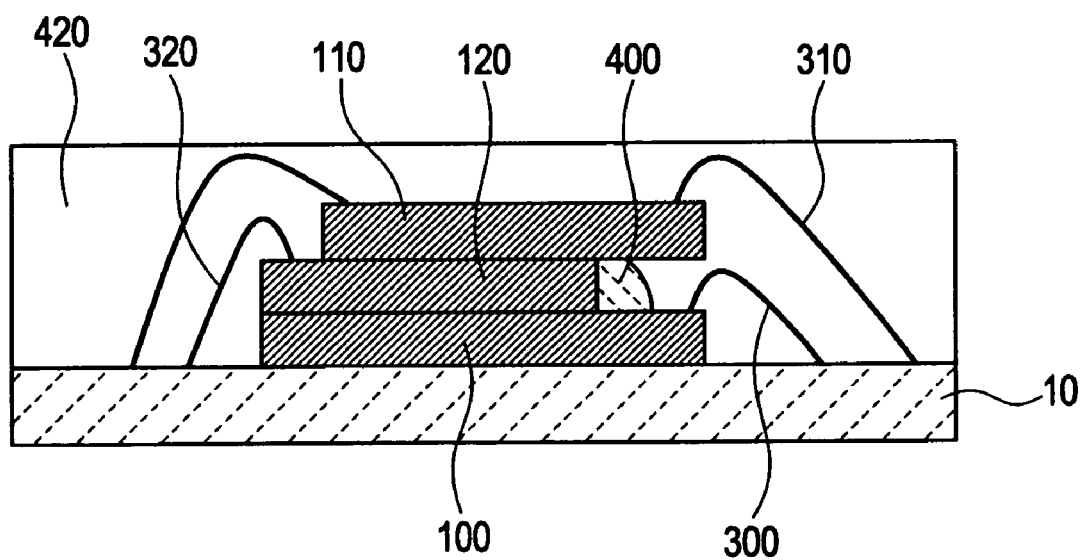
FIG. 14 is a sectional view showing the configuration of an electronic device according to a seventh embodiment of the present invention.

FIG. 14 is a sectional view showing the configuration of an electronic device according to a seventh embodiment of the present invention. FIG. 14 corresponds to FIG. 1 referred to in the first embodiment. The electronic device of this seventh embodiment is of the same configuration as the electronic device of the first embodiment except that a third semiconductor device 120 is used instead of the support member 200 (shown in FIG. 1, etc.).

More specifically, the third semiconductor device 120 is a semiconductor chip and is mounted on the second semiconductor device 100 in a state in which an active surface thereof faces up. The lower surface of the first semiconductor device 110 is in contact with part of an upper surface of the third semiconductor device 120. At least one side of the third semiconductor device 120 is not covered with the first semiconductor device 110 and the third semiconductor device 120 has plural electrode pads (not shown) in the uncovered region. These electrode pads are coupled through bonding wires 320 to electrodes (not shown) formed on the package substrate 10.

The first semiconductor device 110 is mounted so that at least one side thereof overhangs the third semiconductor device 120 when seen in plan. The first resin layer 400 is formed below a part of the overhanging portion so as to contact a side face of the third semiconductor device 120. In this seventh embodiment it is optional whether the first resin layer 400 covers or does not cover (as shown in FIG. 14) bonding wires 300 and electrode pads on the second semiconductor device 102.

The electronic device manufacturing method according to this seventh embodiment is the same as that described in the first embodiment except that instead of the support member 200 the third semiconductor device 120 is mounted on the second semiconductor device 100. Bonding wires 320 may be provided at any timing insofar as the timing for providing the bonding wires 320 is after mounting of the third semiconductor device 120 onto the second semiconductor device 100 and before the provision of bonding wires 310.

Also according to this seventh embodiment, like the first embodiment, it is possible to suppress the formation of voids in the region below the overhanging portion of the first semiconductor device 110 and possible to suppress the occurrence of peeling between the first resin layer 400 and the second resin layer 420.

Eighth Embodiment

Figure 15:
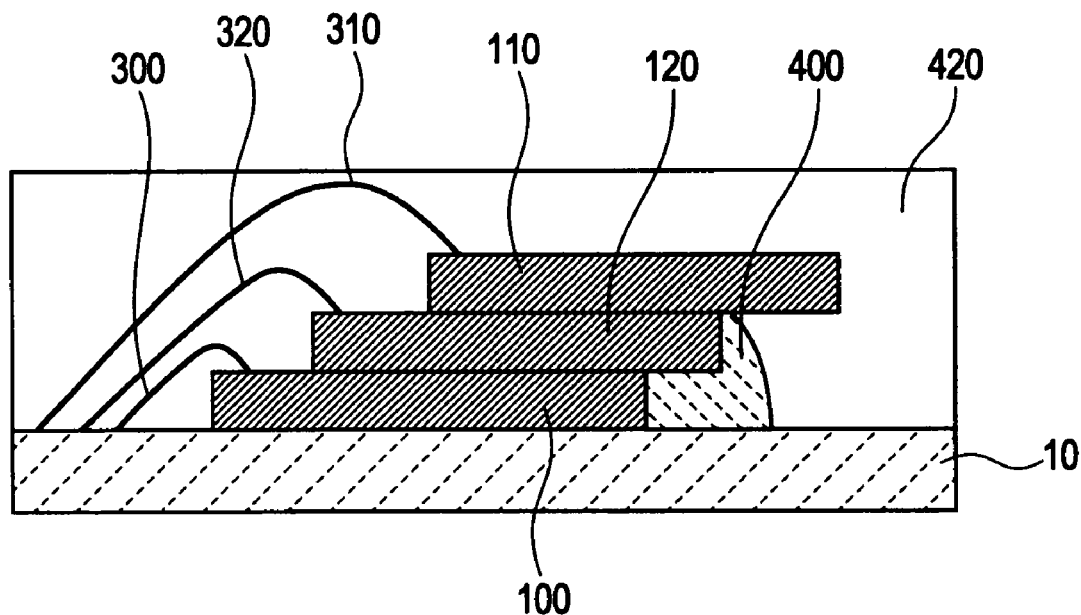
FIG. 15 is a sectional view showing the configuration of an electronic device according to an eighth embodiment of the present invention.

FIG. 15 is a sectional view showing the configuration of an electronic device according to an eighth embodiment of the present invention. FIG. 15 corresponds to FIG. 14 referred to in the seventh embodiment. This electronic device is of the same configuration as the electronic device of the seventh embodiment except the following points.

First, the third semiconductor device 120 is displaced in a first direction (in the right direction in FIG. 15) with respect to the second semiconductor device 100. Likewise, the first semiconductor device 110 is displaced in the first direction with respect to the third semiconductor device 120. That is, when seen in plan, the third semiconductor device 120 overhangs the second semiconductor device 100 in the first direction and the first semiconductor device 110 overhangs the third semiconductor device 120 in the first direction.

Further, the first resin layer 400 is formed in part of the region below the overhanging portion of the third semiconductor device 120 relative to the second semiconductor device 100. In the illustrated example, the first resin layer 400 is formed also in part of the overhanging portion of the first semiconductor device 110 relative to the third semiconductor device 120.

Also according to this eighth embodiment, by the same action as in the seventh embodiment, it is possible to suppress the formation of voids in the region below the overhanging portion of the first semiconductor device 110. It is also possible to suppress the formation of voids in the region below the overhanging portion of the third semiconductor device 120. Further, it is possible to suppress the occurrence of peeling between the first resin layer 400 and the second resin layer 420.

Ninth Embodiment

Figure 16:
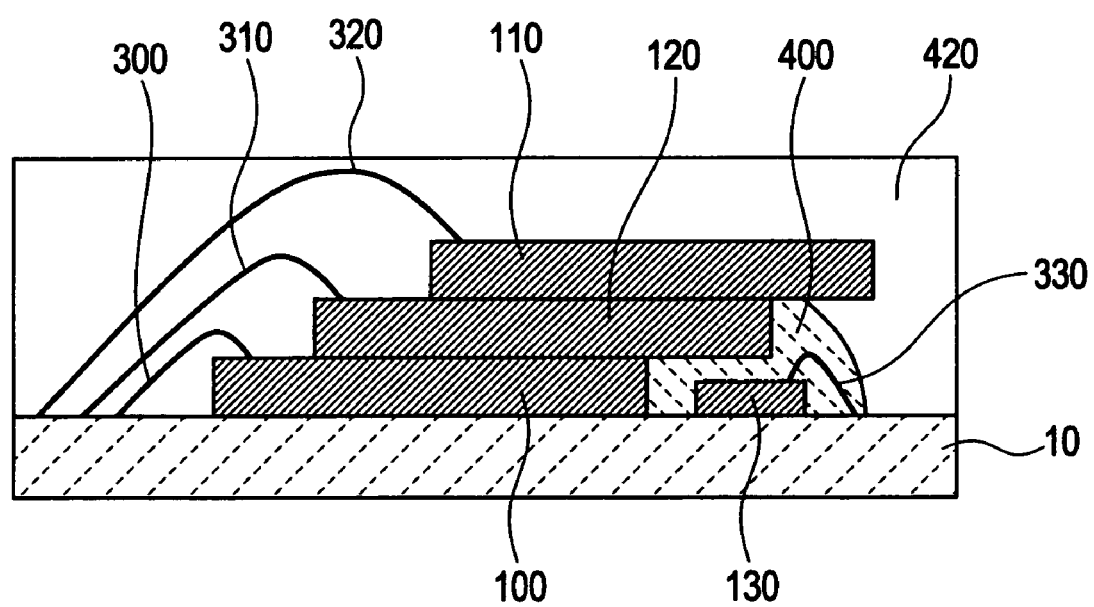
FIG. 16 is a sectional view showing the configuration of an electronic device according to a ninth embodiment of the present invention.

FIG. 16 is a sectional view showing the configuration of an electronic device according to a ninth embodiment of the present invention. FIG. 16 corresponds to FIG. 15 referred to in the eighth embodiment. This electronic device is of the same configuration as the electronic device of the eighth embodiment except that a fourth semiconductor device 130, e.g., a semiconductor chip, is provided.

The fourth semiconductor device 130 is mounted on the package substrate 10 through a mount material (not shown) and is positioned below the overhanging portion of the third semiconductor device 120. The fourth semiconductor device 130 is coupled to the package substrate 10 through bonding wires 330. The fourth semiconductor device 130 and the bonding wires 330 are sealed with the first resin layer 400. The fourth semiconductor device 130 may be flip-chip-mounted onto the package substrate 10.

Also according to this ninth embodiment it is possible to obtain the same effects as in the eighth embodiment. In case of disposing the fourth semiconductor device 130 below the overhanging portion of the third semiconductor device 120, voids are apt to occur around the fourth semiconductor device 130 when forming the second resin layer 420. According to this ninth embodiment, in view of this point, the fourth semiconductor device 130 is sealed with the first resin layer 400 beforehand. Consequently, it is possible to suppress the formation of voids around the fourth semiconductor device 130.

Tenth Embodiment

Figure 17:
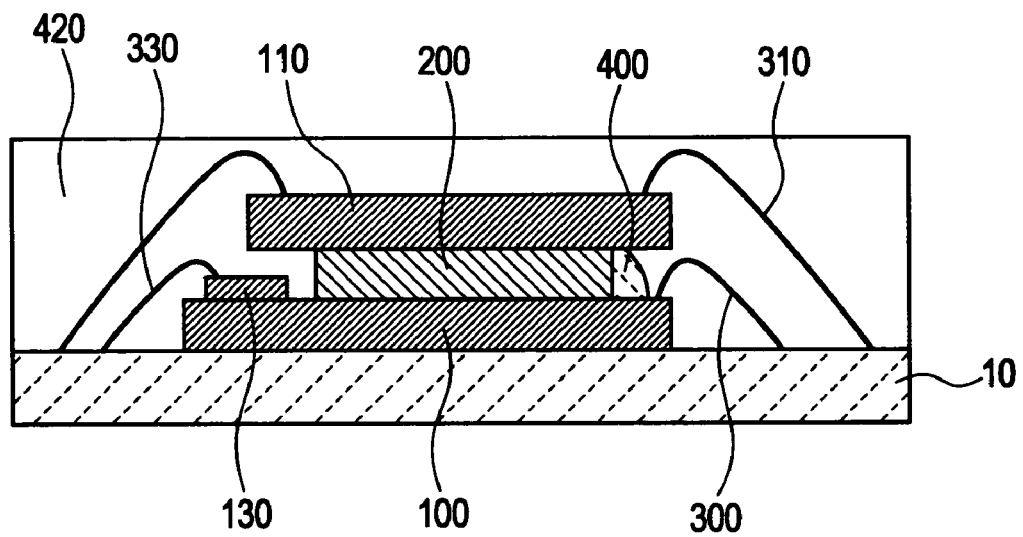
FIG. 17 is a sectional view showing the configuration of an electronic device according to a tenth embodiment of the present invention.

FIG. 17 is a sectional view showing the configuration of an electronic device according to a tenth embodiment of the present invention. This electronic device is of the same configuration as the electronic device of the first embodiment except that a fourth semiconductor device 130 is disposed in a portion of the active surface of the second semiconductor device 100 which portion is not covered with the support member. The fourth semiconductor device 130 is coupled to the package substrate 10 through bonding wires 330.

Also according to this tenth embodiment it is possible to obtain the same effects as in the first embodiment.

Eleventh Embodiment

Figure 18:
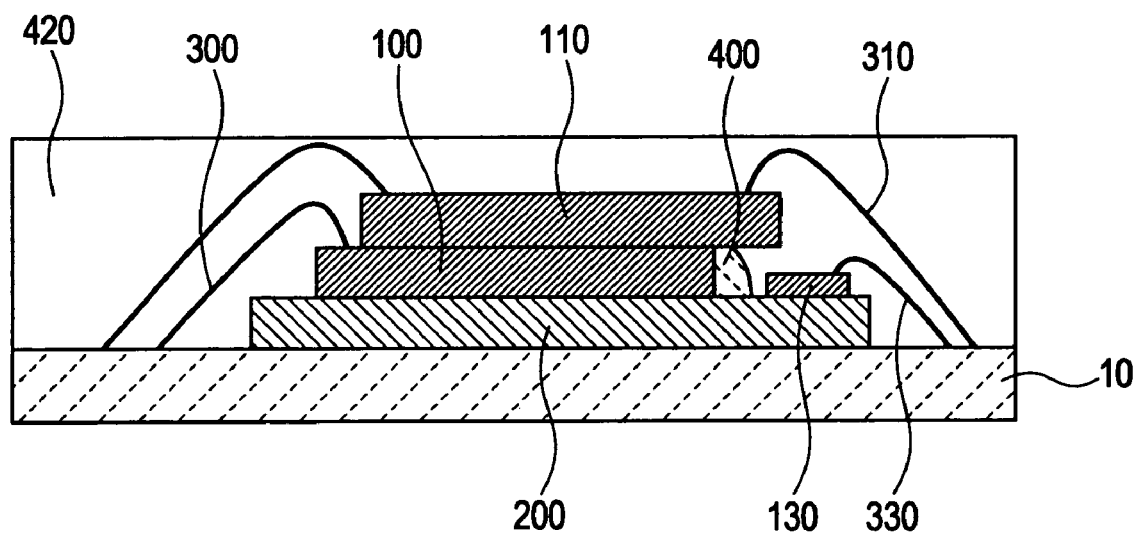
FIG. 18 is a sectional view showing the configuration of an electronic device according to en eleventh embodiment of the present invention.

FIG. 18 is a sectional view showing the configuration of an electronic device according to an eleventh embodiment of the present invention. This electronic device has the following configuration.

A support member 200 is mounted on a package substrate 10 through a mount material (not shown). On the support member 200 is mounted a second semiconductor device 100 through a mount material (not shown). On the second semiconductor device 100 is mounted a first semiconductor device 110 through a mount material (not shown). At least one side of the second semiconductor device 100 is not covered with the first semiconductor device 110. The second semiconductor device 100 has plural electrode pads (not shown) in the uncovered region. Those electrode pads are coupled to the package substrate 10 through bonding wires 300.

The first semiconductor device 110 overhangs an opposite side of the second semiconductor device 100 to form an overhanging portion with respect to the second semiconductor device 100. In this overhanging portion is formed a first resin layer 400 as in the first embodiment. The first semiconductor device 110 is coupled to the package substrate 10 through bonding wires 310.

A fourth semiconductor device 130 is also mounted on the support member 200 through a mount material (not shown). When seen in plan, the fourth semiconductor device 130 is disposed so as to partially overlap the overhanging portion of the first semiconductor device 10. The fourth semiconductor device 130 is coupled to the package substrate 10 through bonding wires 330. In the illustrated example the first resin layer 400 does not cover the fourth semiconductor device 130, but it may cover at least a side of the fourth semiconductor device 130 which side faces the second semiconductor device 100, or it may cover the whole of the fourth semiconductor device 130.

According to this eleventh embodiment, since the fourth semiconductor device 130 is provided, voids are apt to occur below the overhanging portion of the first semiconductor device 110 at the time of forming a second resin layer 420. However, since the first resin layer 400 is provided, it is possible to suppress the formation of voids. Besides, since the first resin layer 400 is formed in only a part of the environs of the second semiconductor device 100, it is possible to suppress an increase in area of the interface between the first resin layer 400 and the second resin layer 420. Consequently, it is possible to suppress the occurrence of peeling between the first resin layer 400 and the second resin layer 420.

Twelfth Embodiment

Figure 19:
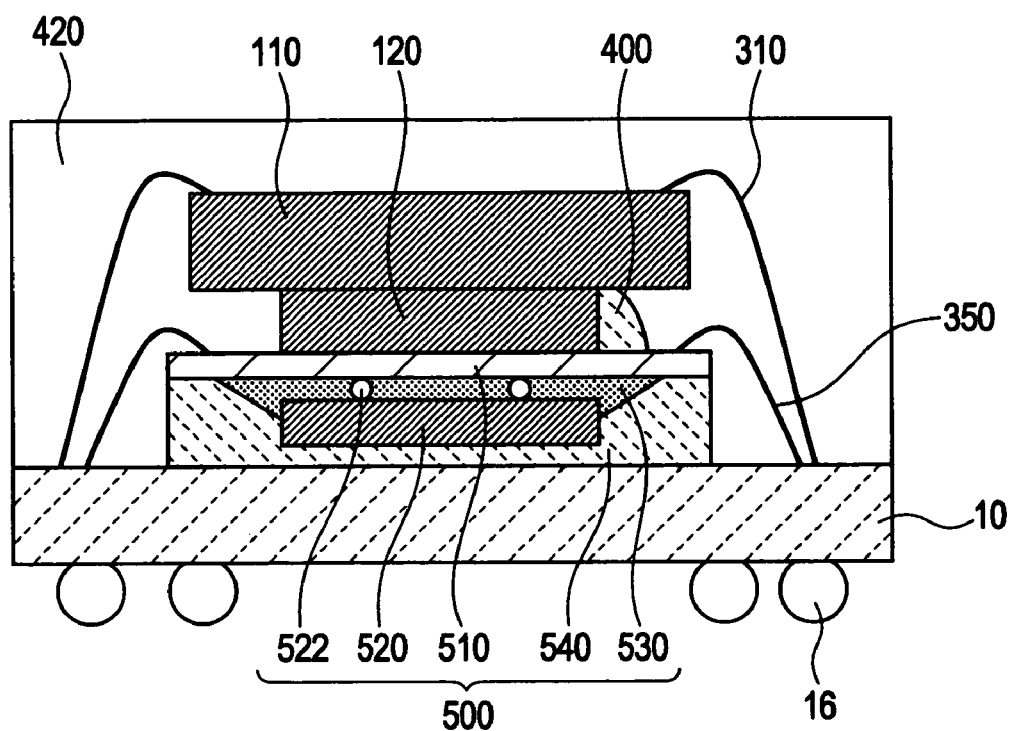
FIG. 19 is a sectional view showing the configuration of an electronic device according to a twelfth embodiment of the present invention.

FIG. 19 is a sectional view showing the configuration of an electronic device according to a twelfth embodiment of the present invention. FIG. 19 corresponds to FIG. 1 referred to in the first embodiment. This electronic device has a Package in Package structure. This electronic device is of the same configuration as the electronic device of the first embodiment except that it has a semiconductor package 500 instead of the second semiconductor device 100 and has a third semiconductor device 120 instead of the support member 200. That is, in this embodiment, the semiconductor package 500 is used as one support member.

More specifically, the semiconductor package 500 is mounted on the package substrate 10 through a mount material (no shown). In the semiconductor package 500, a semiconductor chip 520 is flip-chip-mounted onto a package substrate 510 using bumps 522 and is sealed using underfill resin 530 and sealing resin 540. The semiconductor package 500 is mounted on the package substrate 10 in a state in which the package substrate 510 faces up. The package substrate 510 is coupled to the package substrate 10 through bonding wires 350.

Over the semiconductor package 500 are mounted a third semiconductor device 120 and a first semiconductor device 110 in this order. The first semiconductor device 110 is a semiconductor chip and the third semiconductor device 120 is a semiconductor package, provided the first semiconductor device 110 may be a semiconductor package. The first semiconductor device 110 is larger in planar shape than the third semiconductor device 120. The first semiconductor device 110 overhangs the third semiconductor device 120 throughout the whole circumference and a first resin layer 400 is formed below a part of the overhanging portion.

External terminals, e.g., solder balls, are provided on a lower surface of the package substrate 10.

Figure 20:
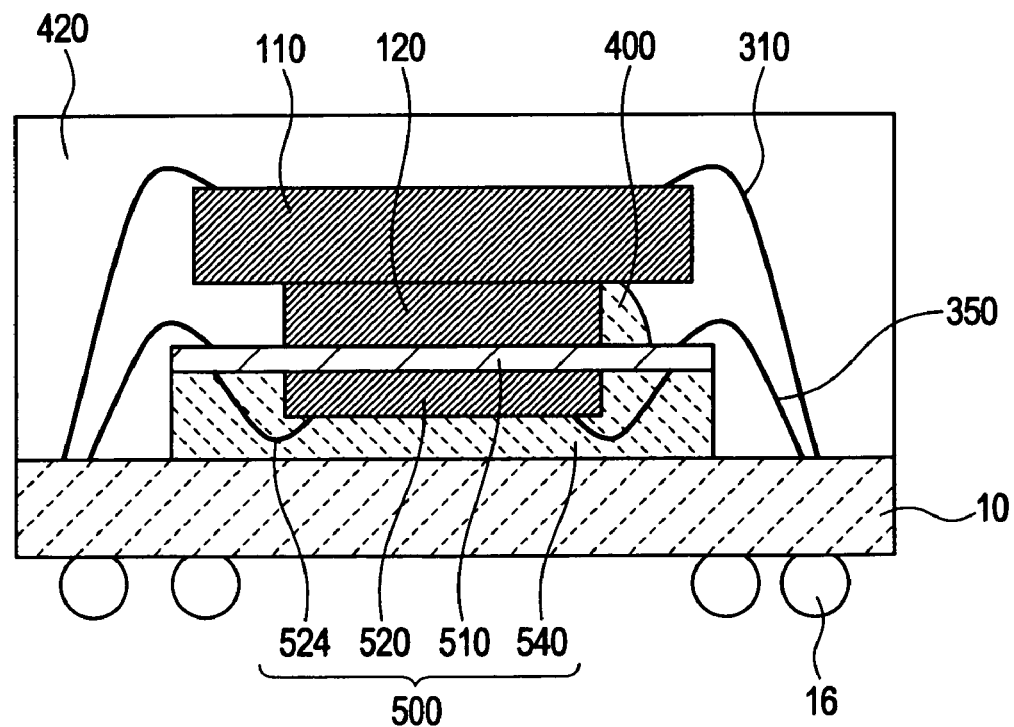
FIG. 20 is a diagram showing a modification of FIG. 19.

FIG. 20 is a diagram showing a modification of FIG. 19. The electronic device shown in FIG. 20 is of the same configuration as the electronic device of FIG. 19 except that the semiconductor chip 520 is coupled, not flip-chip-mounted, to the package substrate 510 through bonding wires 524.

Also according to this twelfth embodiment it is possible to obtain the same effects as in the first embodiment.

Thirteenth Embodiment

Figure 21:
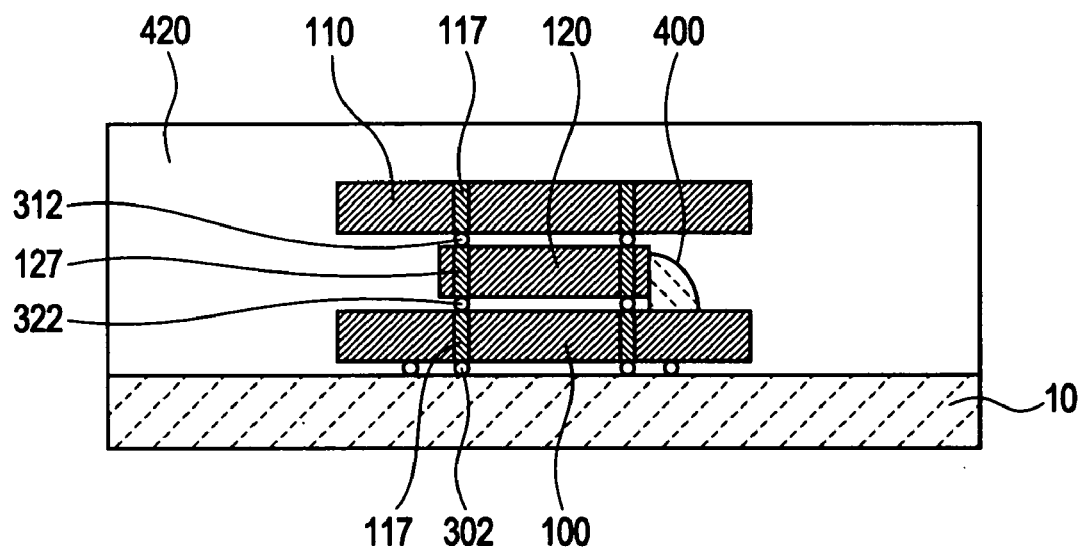
FIG. 21 is a sectional view showing the configuration of an electronic device according to a thirteenth embodiment of the present invention.

FIG. 21 is a sectional view showing the configuration of an electronic device according to a thirteenth embodiment of the present invention. This electronic device is of the same configuration as the electronic device of the first embodiment except the following points.

First, the electronic device of this thirteenth embodiment has a third semiconductor device 120 instead of the support member 200. The third semiconductor device 120 is for example a semiconductor chip and is flip-chip-mounted to a second semiconductor device 100. The second semiconductor device 100 is flip-chip-mounted to the package substrate 10 and the first semiconductor device 110 is flip-chip-mounted to the third semiconductor device 120. The third semiconductor device 120 has through electrodes 127 and is coupled to the second semiconductor device 100 through the through electrodes 127 and bumps 322. The first semiconductor device 110 has through electrodes 117 and is coupled to the third semiconductor device 120 through the through electrodes 117 and bumps 312. The second semiconductor device 100 also has through electrodes 117 and is coupled to the package substrate 10 through the through electrodes 117 and bumps 302.

When seen in plan, the third semiconductor device 120 is smaller than the first semiconductor device 110 and is also smaller than the second semiconductor device 100. Therefore, both first semiconductor device 110 and second semiconductor device 100 overhang the third semiconductor device 120. A first resin layer 400 has the same layout as in the electronic device of the first embodiment.

Also according to this thirteenth embodiment it is possible to obtain the same effects as in the first embodiment.

Fourteenth Embodiment

Figure 22:
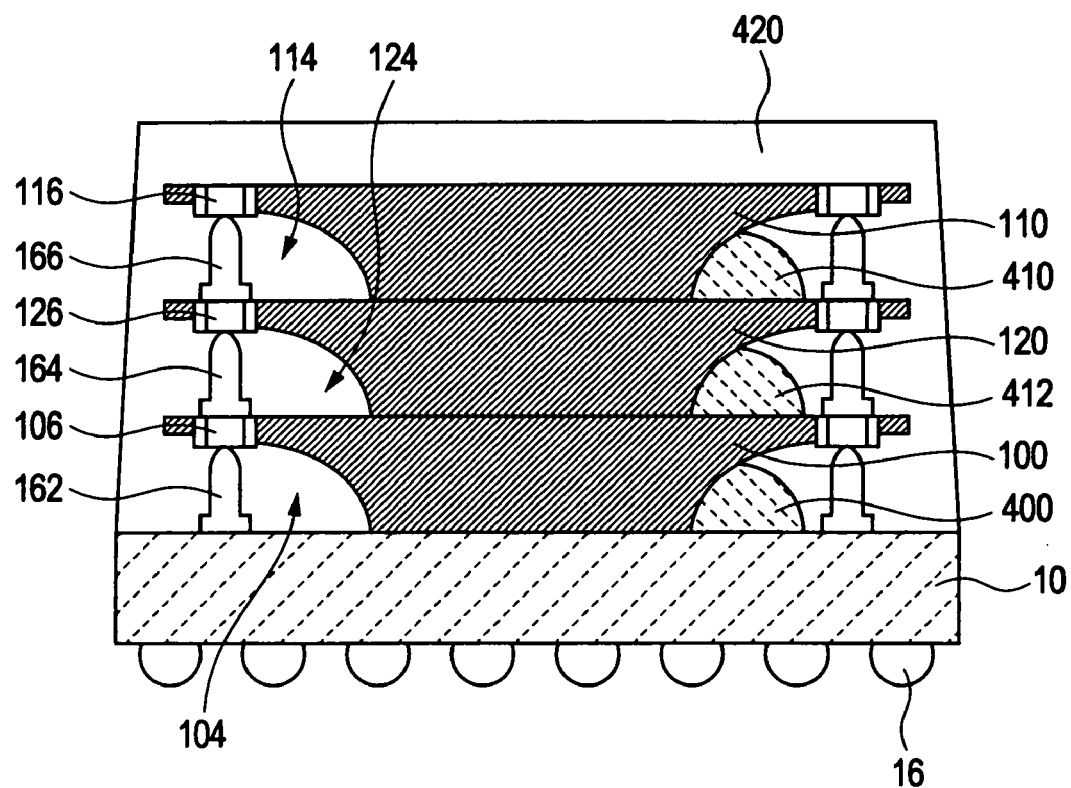
FIG. 22 is a sectional view showing the configuration of an electronic device according to a fourteenth embodiment of the present invention.

FIG. 22 is a sectional view showing the configuration of an electronic device according to a fourteenth embodiment of the present invention. This electronic device comprises a second semiconductor device 100, a third semiconductor device 120 and a first semiconductor device 110, which are stacked in this order on a package substrate 10 in such a manner that active surfaces thereof face up. The first semiconductor device 110, the second semiconductor device 100 and the third semiconductor device 120 are semiconductor chips each having a square or rectangular plane shape, provided their back-side edges are depressed throughout the whole circumference with respect to their other portions on the back side. Therefore, a space 114 is formed throughout the whole circumference below the edge of the first semiconductor chip 110. Likewise, a space 124 is formed throughout the whole circumference below the edge of the third semiconductor device 120. Further, a space 104 is formed throughout the whole circumference below the edge of the second semiconductor device 100. For example, the depressions which form the spaces 114, 124 and 104 can each be formed by forming grooves on a back surface of a wafer along dicing lines prior to package dicing from the wafer. Side faces of the depressions are curved faces.

The first semiconductor device 110, the third semiconductor device 120 and the second semiconductor device 100 are provided in respective edges with plural through holes 116, 126 and 106. The through electrodes 116 are coupled to the through electrodes 126 of the third semiconductor device 120 through stud bumps 166 provided in the space 114. The through electrodes 126 are coupled to the through electrodes 106 of the second semiconductor device 100 through stud bumps 164 provided in the space 124. The second semiconductor device 100 is coupled to the package substrate 10 through stud bumps 162 provided in the space 104.

First resin layers 410, 412 and 400 are partially formed in the spaces 114, 124 and 104 respectively so as to contact side faces of the depressions which form the spaces 114, 124 and 104 on the back surfaces of the semiconductor devices. The layout of the first resin layers 410, 412 and 400 in plan view is the same as the layout of the first resin layer 400 in the first embodiment. The first semiconductor device 110, the second semiconductor device 100 and the third semiconductor device 120 are sealed with a second resin layer 420.

This electronic device can be formed in the following manner. First, the stud bumps 162 and the second semiconductor device 100 are mounted on the package substrate 10 in a state in which the back surface of the second semiconductor device 100 faces down. Then, the first resin layer 400 is formed so as to contact the side face of the depression which forms the space 104. Next, the stud bumps 164 and the third semiconductor device 120 are mounted on the second semiconductor device 100 in a state in which the back surface of the third semiconductor device 120 faces down. Then, the first resin layer 412 is formed so as to contact the side face of the depression which forms the space 124. Subsequently, the stud bumps 166 and the first semiconductor device 110 are mounted on the third semiconductor device 120 in a state in which the back surface of the first semiconductor device 110 faces down. Then, the first resin layer 410 is formed so as to contact the side face of the depression which forms the space 114. Thereafter, the first semiconductor device 110, the second semiconductor device 100 and the third semiconductor device 120 are sealed with the second resin layer 420. How to form the second resin layer 420 is the same as in the first embodiment.

Voids are apt to be formed in the spaces 104, 114 and 124 when forming the second resin layer 420. According to this fourteenth embodiment, in view of this point, the first resin layers 400, 410 and 412 are formed in regions of the spaces 104, 114 and 124 which regions are apt to form voids, prior to forming the second resin layer 420. Therefore, it is possible to suppress the formation of voids in the spaces 104, 114 and 124 when forming the second resin layer 420. Besides, since the first resin layers 400, 410 and 412 are formed only partially in the spaces 104, 114 and 124, it is possible to suppress an increase in area of the interfaces between the first resin layers 400, 410, 412 and the second resin layer 420. Consequently, it is possible to suppress the occurrence of peeling between the first resin layers 400, 410, 412 and the second resin layer 420.

Although embodiments of the present invention have been described above with reference to the drawings, the above embodiments are merely illustrative of the present invention and various other configurations may be adopted.

What is claimed is:

1. A method for manufacturing an electronic device, the method comprising:
    disposing a support member over a package substrate;
    forming a first resin layer in part of an environs of the support member so as to contact the support member;
    mounting a first semiconductor device over the support member in a state in which the first semiconductor device overhangs the support member at least in a direction where the first resin layer is formed; and
    sealing the support member and the first semiconductor device with a second resin layer supplying from a side opposite to the first resin layer through the support member,
    wherein the support member comprises a square or rectangular plane shape, and the first resin layer is formed on one side of the support member.

2. The method according to claim 1, wherein the first resin layer is formed in a region of not less than 20% and not more than 100% of the one side of the support member.

3. The method according to claim 1, further comprising, after the forming the first resin layer in part of the environs of the support member, mounting the first semiconductor device over the support member.

4. The method according to claim 3, wherein in the forming the first resin layer in part of the environs of the support member, the first resin layer is formed so that an upper end thereof is positioned higher than an upper surface of the support member.

5. The method according to claim 1, further comprising, before the forming the first resin layer in part of the environs of the support member, mounting the first semiconductor device over the support member.

6. The method according to claim 1, further comprising, before the disposing the support member over the package substrate, mounting a second semiconductor device over the package substrate,
    wherein in the disposing the support member over the package substrate, the support member is disposed over the second semiconductor device.

7. The method according to claim 6, wherein the second semiconductor device is disposed on the package substrate so that an active surface thereof faces up, and
    the method further comprises coupling an external terminal of the second semiconductor device and the package substrate with each other through a bonding wire, after disposing the second semiconductor device over the package substrate and before forming the first resin layer.

8. The method according to claim 7, wherein in the forming the first resin layer, the external terminal of the second semiconductor device and the bonding wire are not covered with the first resin layer.

9. The method according to claim 1 wherein the support member comprises a semiconductor device.

10. The method according to claim 1, wherein the first semiconductor device comprises a semiconductor chip.

11. The method according to claim 1, wherein the support member comprises a semiconductor package.

12. An electronic device comprising:
    a package substrate;
    a support member disposed over the package substrate;
    a first semiconductor device disposed over the support member, at least a part of the first semiconductor device overhanging the support member in plan view;
    a first resin layer filling up a space below the first semiconductor device in part of the overhanging portion of the first semiconductor device around the support member, the first resin layer being in contact with the support member; and a second resin layer sealing the first semiconductor device and the support member, wherein the support member comprises a square or rectangular plane shape, and the first resin layer is formed on one side of the support member.

13. The electronic device according to claim 12, further comprising a bonding wire for coupling the first semiconductor device and the package substrate with each other, wherein a vertex of the bonding wire is positioned closer to the first resin layer with respect to a straight line joining both ends of the bonding wire.

14. The electronic device according to claim 12, further comprising a second semiconductor device mounted over the package substrate, wherein the support member is disposed over the second semiconductor device.

15. The electronic device according to claim 14, wherein the second semiconductor device is disposed over the package substrate so that an active surface thereof faces up, and wherein the electronic device further comprises a bonding wire for coupling an external terminal of the second semiconductor device and the package substrate with each other, and the first resin layer does not cover the external terminal and the bonding wire.

16. A method for manufacturing an electronic device, the method comprising:

disposing a support member over a package substrate;

forming a first resin layer in part of an environs of the support member so as to contact the support member;

mounting a first semiconductor device over the support member in a state in which the first semiconductor device overhangs the support member at least in a direction where the first resin layer is formed; and sealing the support member and the first semiconductor device with a second resin layer supplying from a side opposite to the first resin layer through the support member, wherein the support member comprises one of a semiconductor device and a semiconductor package.

* * * * *